United States Patent [19]

Bayer et al.

[11] Patent Number: 5,569,363
[45] Date of Patent: Oct. 29, 1996

[54] INDUCTIVELY COUPLED PLASMA SPUTTER CHAMBER WITH CONDUCTIVE MATERIAL SPUTTERING CAPABILITIES

[75] Inventors: Robert Bayer, West Milford, N.J.; Alexander D. Lantsman, Middletown; James A. Seirmarco, Buchanan, both of N.Y.

[73] Assignees: Sony Corporation, Tokyo, Japan; Materials Research Corporation, Orangeburg, N.Y.

[21] Appl. No.: 326,743

[22] Filed: Oct. 25, 1994

[51] Int. Cl.$^6$ .................................................. C23C 14/34
[52] U.S. Cl. ................................ 204/192.32; 204/192.1; 204/298.11; 204/298.31; 204/298.37
[58] Field of Search ..................... 204/192.32, 192.1, 204/298.38, 192.12, 298.11, 298.31, 298.37; 156/345; 118/723 I

[56] References Cited

U.S. PATENT DOCUMENTS

| | | | |
|---|---|---|---|
| 4,123,316 | 10/1978 | Tsuchimoto | 204/298.37 X |
| 4,431,901 | 2/1984 | Hull | 219/121 PR |
| 4,486,461 | 12/1984 | Ito et al. | 118/723 I X |
| 4,572,759 | 2/1986 | Benzing | 204/298.37 X |
| 5,099,100 | 3/1992 | Bersin et al. | 219/121.4 |
| 5,217,560 | 6/1993 | Kurono et al. | 156/345 |
| 5,234,529 | 8/1993 | Johnson | 156/345 |

FOREIGN PATENT DOCUMENTS

| | | |
|---|---|---|
| 0 607 797 | 7/1994 | European Pat. Off. . |

*Primary Examiner*—Nam Nguyen
*Attorney, Agent, or Firm*—Wood, Herron & Evans, P.L.L.

[57] ABSTRACT

A shade is disposed on the inner wall of an inductively coupled plasma chamber, covering a protected zone of the wall generally opposite to the inductive coil driving the chamber, preventing accumulation of material sputtered from a wafer in this zone, and thus restricting closed paths for eddy current flow along the chamber wall, improving inductive coupling of electrical power to the plasma in the chamber.

27 Claims, 2 Drawing Sheets

5,569,363

1

INDUCTIVELY COUPLED PLASMA SPUTTER CHAMBER WITH CONDUCTIVE MATERIAL SPUTTERING CAPABILITIES

FIELD OF THE INVENTION

The present invention relates to inductively coupled sputtering of conductive materials.

BACKGROUND OF THE INVENTION

In a sputtering process, a substrate to be processed, such as a semiconductor wafer, is mounted in a vacuum chamber reactor filled with a gas. The gas in the reactor is subjected to electrical excitation, producing a plasma in the reactor. In a sputter etching process, ions from the plasma bombard the surface of the substrate, ejecting particles of any coating on the wafer surface. The ejected particles predominantly adhere to and coat the interior surfaces of the reactor. In a sputter coating process, a target is placed in the reactor, and ions from the plasma bombard the target, ejecting particles from the target which adhere to the wafer and the interior surfaces of the reactor.

In an inductively coupled sputtering reactor, the chamber is nonconducting. Electrical excitation is in part provided by magnetic fields generated by a helical coil formed around the outside of the chamber. The coil is separated from the chamber by a magnetically impermeable barrier wall such as a quartz jar.

A difficulty with inductively coupled sputtering of metals or other electrically conductive coatings is that particles sputtered, e.g., from the wafer, tend to form a conductive film on the inside of the chamber. If the chamber is not cleaned regularly, this film will accumulate, and the resistance of the film will be small enough that magnetic fields from the coil will induce eddy currents in the conductive film. These eddy currents will tend to oppose penetration of magnetic fields from the coil into the chamber, deteriorating plasma ignition performance, or in severe cases preventing plasma ignition altogether.

Regular cleaning or replacement of the chamber can be costly both in effort expended and in downtime. And, even regular cleaning does not prevent some performance reduction as conductive films accumulate inside the reactor. Accordingly, significant cost and performance advantages can be gained from an inductively coupled plasma sputter etching reactor which is not susceptible to plasma deterioration due to conductive film accumulation on the interior of the reactor chamber.

SUMMARY OF THE INVENTION

In accordance with principles of the present invention, a shade is disposed on the inside wall of an inductively coupled plasma chamber. The shade covers a protected zone of the wall generally opposite to the inductive coil driving the chamber, and prevents accumulation of sputtered material in this zone, thus reducing closed paths for eddy current flow along the chamber wall, and improving inductive coupling of electrical power to the plasma in the chamber.

In specific embodiments, the shade is elongated and has its elongated direction generally parallel to the axis of the inductive coil. The shade includes one or more supports in contact with the chamber wall and extending generally inwardly from the chamber wall, supporting an elongated hood which extends generally tangentially (parallel to the chamber wall) from the support, covering the protected zone. In some embodiments, two or more elongated shades may cooperate to cover the protected zone.

The shade may cover a protected zone extending across the entire length of the coil; or, alternatively, the shade may cover only a partial length of the coil, so long as eddy current paths on the inside of the reactor are sufficiently inhibited to allow inductive coupling of power from the coil to a plasma in the chamber.

A chamber in accordance with the invention is thus not susceptible to eddy currents caused by accumulation of a conductive film on the inside of the chamber, thus improving plasma ignition performance, and reducing the need for costly regular cleaning of the chamber. These and other objects and advantages of the present invention shall be made apparent from the accompanying drawings and the description thereof.

BRIEF DESCRIPTION OF THE DRAWING

The accompanying drawings, which are incorporated in and constitute a part of this specification, illustrate embodiments of the invention and, together with the general description of the invention given above, and the detailed description of the embodiments given below, serve to explain the principles of the invention.

DETAILED DESCRIPTION OF SPECIFIC EMBODIMENTS

Figure 1:
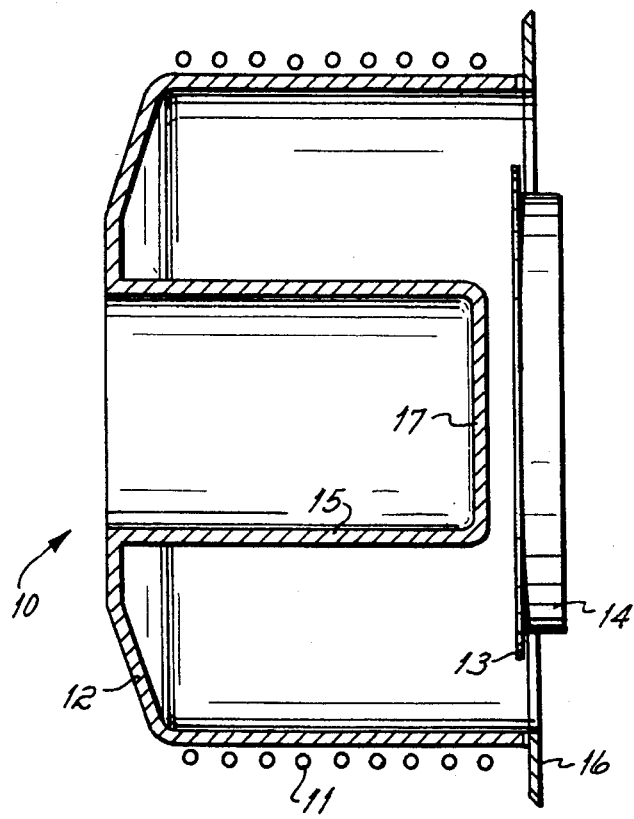
FIG. 1 is a cross-sectional view of an inductively coupled plasma processing reactor.

Referring to FIG. 1, an inductively coupled plasma reactor 10, for example a plasma sputter etching reactor, has in general a helical or spiral coil 11 for plasma excitation which is wound around a cylindrical chamber 12, for example a quartz jar having a 12 inch diameter, height of approximately 8 inches and wall thickness of approximately one-quarter inch. Jar 12 must withstand high vacuum, for example of $10^{-8}$ Torr. The coil 11 and jar 12 are supported by a housing platform 16 and contained within a housing (not shown).

Coil 11 is manufactured of a 50 foot length of one-eighth inch diameter copper tubing, wound into approximately 15.5 turns around the outer surface of jar 12. Electrical terminals are connected to the ends of the copper tubing. Cooling water flows through the center of the tubing to stabilize the coil's operating temperature.

Coil 11 is electrically excited at a medium range frequency, such as in the range of 100–800 kHz, or specifically 450 kHz, to produce a magnetic field inside of the jar 12. Electrical excitation for coil 11 is generated by a power supply (not shown), such as a PDP 2500 450 kHz 2000 Watt generator, available from Advanced Energies Industries, Inc., 1600 Prospect Parkway, Fort Collins, Colo. 84525. Approximately 1250 Watts of electrical power are consumed by the coil. This electrical energy is coupled to coil 11 through a power matching network (not shown), such as the power matching network for the RMX-10 and RMX-12, available from Materials Research Corporation, Route 303, Orangeburg, N.Y. 10962. The electrical connections and the frequency of excitation of the coil 11 will differ for different specific applications.

A wafer 13 to be processed in the plasma sputter etching reactor is placed on a wafer chuck 14 inside of jar 12. Wafer 13 may have a diameter of four to eight inches, but in the illustrated process the wafer has an eight inch diameter. Jar 12 is evacuated to near vacuum conditions by a vacuum pump (not shown). Radio frequency (RF) power is applied to the wafer chuck 14 relative to the housing 15 and platform 16, e.g., at a frequency of 13.56 MHz and a power level of approximately 2000 Watts, generating a 125 Volt DC voltage on the wafer during the process. One suitable power supply is a model AEG-10B-02 RF power generator, available from ENI Corporation, a division of Astec America, Inc., 100 High Power Road, Rochester, N.Y. 14623. At the same time, medium range frequency energy is applied to coil 11, as discussed above.

A gas flows into the evacuated jar 12 at a low rate, producing a low pressure. For example, Argon flows into jar 12 at a rate of 15–50 sccm, e.g., 20 sccm, at a pressure of 0.5–1 milliTorr, e.g., 0.7 milliTorr.

The combination of electrical excitation from coil 11 and from RF power applied to chuck 14 causes the gas in jar 12 to ionize and form a gas plasma inside of jar 12. Ions from the plasma bombard the surface of wafer 13, causing any exposed film on the surface of wafer to sputter away from the surface 13 and into jar 12. Thus the surface of the wafer is etched by plasma bombardment. Processing of a wafer takes about 120 seconds.

As illustrated in FIG. 1, jar 12 includes a reentry tube 15 having a cylindrical section and a diameter of approximately four and three-quarter inches. Reentry tube 15 extends from the surface of jar 12 to a closed end 17 spaced approximately three-quarter inches from the surface of the wafer. The inside of this reentry tube is open to the atmosphere outside of jar 12, i.e., is not evacuated. Reentry tube 15 prevents formation of a plasma in the central section of jar 12, and thus reduces the etching rate at the center of the wafer. Without the reentry tube, the etching rate on the wafer would be significantly higher at the center of the wafer than at the edges. The reentry tube reduces the etching rate at the center of the wafer, resulting in more uniform etching of the wafer.

During the etching process materials removed from the wafer are predominantly deposited on the inner surface of the jar 12. Etching of metals or other conductive materials from the surface of wafer 13 causes a conductive film to form on the interior surface of jar 12. The conductivity of this layer grows with the number of wafers processed in the jar 12. Etching of some non-conductive metal-containing films may have similar consequences due to chemical reactions which occur during processing.

A conductive coating formed on the interior surface of jar 12 behaves as an electrical shield which prevents coil 11 from coupling magnetic field into the process gas in jar 12 and therefore preventing plasma ignition. Changing magnetic fields produced by coil 11 induce eddy currents in the conductive coating. The eddy currents will circulate in the conductive film around the cylindrical walls of jar 12 in the direction generally parallel and opposite to the direction of current flow in coil 11. The induced eddy currents produce an equal and opposite magnetic field in jar 12, tending to repel and eliminate magnetic fields generated by coil 11.

When a conductive film of sufficient thickness has accumulated on the inside of jar 12, it will become impossible to ignite a plasma inside of the jar 12. As a result, jar 12 must be cleaned or replaced for further processing to be performed. This can result in significant costs and down time in the etching process.

Difficulties associated with deposition of the conductive films on the inside of a plasma processing chamber were demonstrated as follows. Six inch silicon wafers, covered with 100 nm deposited titanium films, were etched using inductively coupled plasma etching inside the reactor shown in FIG. 1, under conditions discussed above. After 20 to 25 wafers had been etched in this manner, plasma ignition completely failed and further processing was impossible. At this time, the interior of jar 12 was examined and it was found that a conductive film had deposited on the interior of the jar having sheet resistance of between 30 and 400 ohm-meters in the area of coil 11, as measured with probes placed a distance of one-half inch apart on the interior surface of the jar. Lower values of sheet resistance were recorded at regions of the jar at close proximity to the surface of wafer 13 from which material was being sputtered.

In accordance with the principles of the present invention, the above difficulties are alleviated by preventing the creation of a continuous path of deposited material on the interior of jar 12 through which eddy currents may flow. This is done by creating a non-conductive protected zone, having an elongated shape, on the inner surface of the jar, placed in a direction generally parallel to the central axis of jar 12 and coil 11 and perpendicular to the direction of flow of induced eddy currents. This non-conductive protected zone prevents the flow of significant eddy currents in a conductive film on the inside of quartz jar 12, thereby preventing generation of opposing magnetic fields.

Figures 2A, 2B:
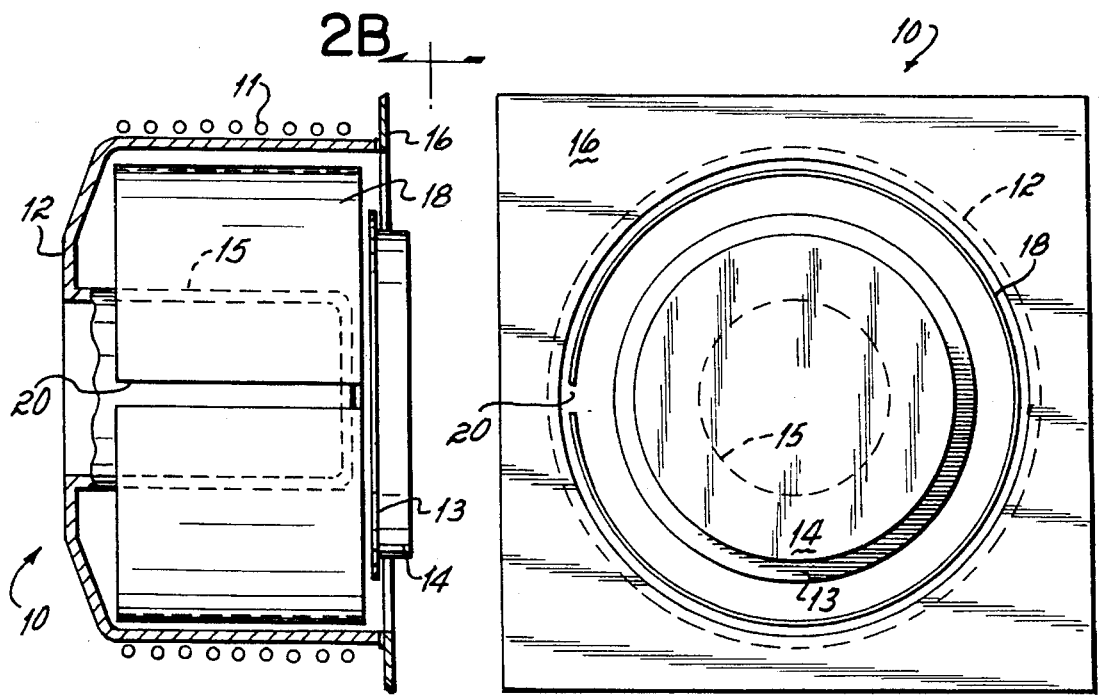
FIG. 2A is a cross-sectional view of the reactor of FIG. 1 fitted with a conductive cylinder simulating the effect of accumulation of a conductive film in the chamber.
FIG. 2B is a plan view of the reactor of FIG. 2A taken along line 2B—2B.

Referring to FIGS. 2A and 2B, the feasibility of preventing eddy currents through the use of a protected zone was proven by fabricating a stainless steel test element 18 for insertion inside of jar 12. Test element 18 was manufactured of shim stock stainless steel no. SS-304, which has a thickness of 0.006 inches and a width of 6.0 inches. This shim stock was bent into a cylindrical section having a gap 20 of 1.75 inches to form test element 18. This test element 18 was installed inside of jar 12, to simulate the expected thickness of the conductive layer accumulated on the inside of jar 12 after processing of more than 3,000 wafers by sputter etching. Test wafers having a thermal oxide top layer (i.e., a non-conductive top layer) were placed into the chamber, and RF and inductive power were applied to the chamber to simulate plasma processing. (A non-conductive wafer was used to insure that conductive material would not be sputtered from the top layer of the wafer into gap 20, causing a short across gap 20.)

The test apparatus as described above exhibited timely and sustained plasma ignition, apparently unaffected by the presence of stainless shim stock test element 18 in the chamber. This performance confirmed that inclusion of a non-conductive protected zone on the inside surface of jar 12 would prevent eddy current flow and would eliminate difficulties arising from accumulation of conductive materials on the inside surface of jar 12.

Figure 3A:
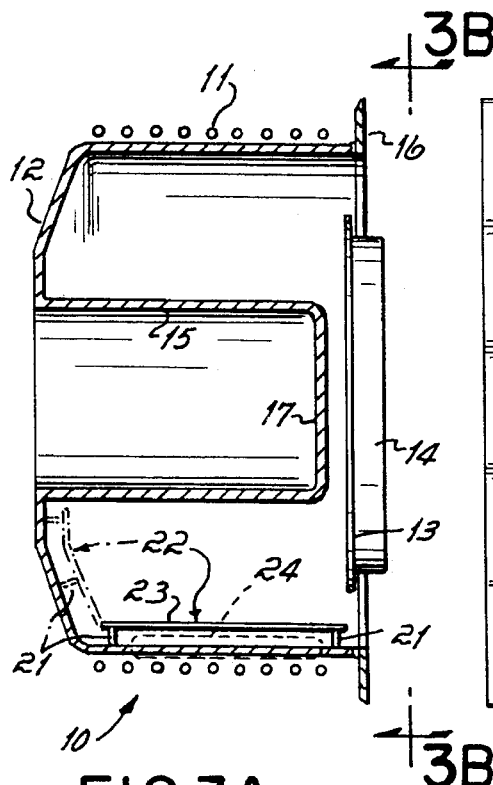
FIG. 3A is a cross-sectional view of the reactor of FIG. 1 supplied with a bench shaped shade 22 which prevents accumulation of conductive film in a protected zone 24 along an elongated section of the chamber wall.
Figure 3B:
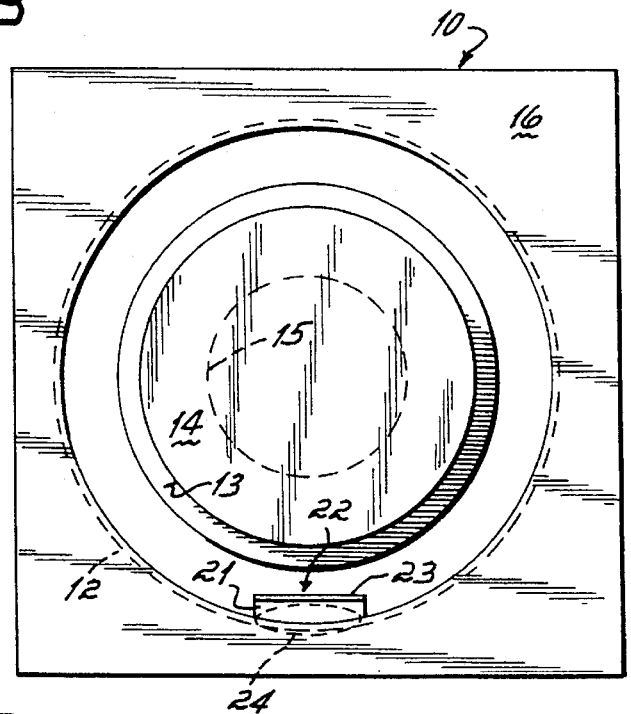
FIG. 3B is a plan view of the reactor of FIG. 3A taken along line 3B—3B.
Figure 3C:
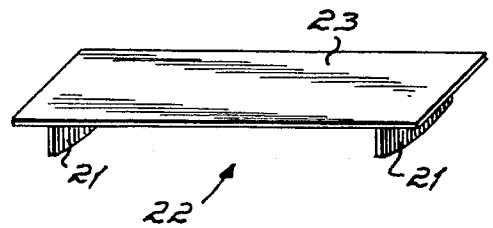
FIG. 3C is a perspective view of the shade 22.

Referring to FIGS. 3A and 3B, one embodiment of a shade for preventing accumulation of conductive material on the inside wall of jar 12 within a protected zone takes the form of an bench 22. Bench 22 comprises, as shown in FIG. 3B, two supports 21 which rest on the jar wall, and a hood 23 which extends in its elongated direction for approximately the entire length of coil 11 in a direction parallel to the axis of coil 11. Supports 21 and extends radially inward (toward the center of jar 12) approximately one-eighth to three-eighths of an inch, and support hood 23 at this approximate height from the wall of jar 12. Hood 23 extends in a tangential direction approximately two inches, creating a protected zone 24 which is shaded from materials sputtered from wafers inside of jar 12. Hood 23 and supports 21 are manufactured of quartz.

Due to the presence of hood 23, material sputtered from a wafer, or from a target in a plasma sputtering system, will not coat the area of jar 12 in the protected zone 24. As a result, although a conductive coating will form over time on the inside surfaces of jar 12, no conductive coating will form in protected zone 24. Therefore eddy currents cannot flow through protected zone 24, and thus cannot flow in an even, circumferential pattern around the cylindrical section of the interior of jar 12.

Figure 4:
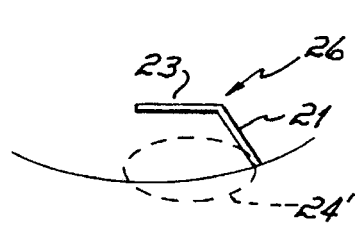
FIGS. 4 and 5 are diagrammatic partial plan views of alternative embodiments of a shade preventing accumulation of conductive film in protected zones 24' and 24".

FIG. 4 illustrates an alternative embodiment of a shade 26 suitable for generating a protected zone on the interior of jar 12. The shade 26 shown in FIG. 4 includes a support 21 which extends along the interior surface of jar 12 in a direction generally parallel to the axis of jar 12 and coil 11. A hood 23 extends over the interior surface of jar 12 at a distance of one-eighth to three-eighths inches from the surface of jar 12, in one tangential direction away from the inner edge of support 21. Hood 23 extends tangentially a sufficient distance, such as two to three inches, over the interior surface of jar 12 to create a protected zone 24' in which sputtered material will not deposit.

Figure 5:
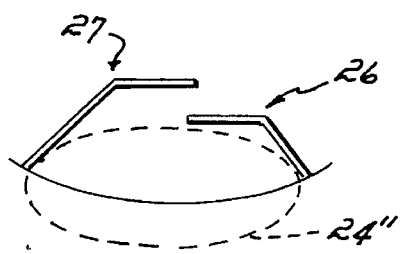

Referring to FIG. 5, in a third embodiment of a shade, two structures 26 and 27 are arranged in overlapping orientation. One structure 26 has a hood extending in a clockwise tangential direction and a second structure 27 has a hood extending in a counter clockwise tangential direction such that the hoods of the first and second structures 26 and 27 overlap and create a protected zone 24" which extends from the support of structure 26 to the support of structure 27. Accordingly, sputter material will not deposit in protected zone 24".

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art.

For example, although a sputter etching apparatus and process has been described, principles of the invention may be applied to other processes, such as sputter coating processes.

Furthermore, while the shade disclosed above extends only on the cylindrical surfaces of jar 12, a shade could also extend radially on the disk-shaped end faces of jar 12 and or the end 17 of reentry tube 15. As illustrated in outline in FIG. 3A, shades of this type could include further supports 21 supporting a hood 22 which extends in a radial direction relative to the axis of coil 11 and hood 12.

This type of shade could be used to particular advantage in a system, such as the so-called transformer coupled plasma ("TCP") systems sold by Lam Research Corporation, in which the inductively coupled coil for exciting the plasma has a spiral shape and is disposed on the disk-shaped end of a bell jar rather than around the cylindrical sides of the bell jar. (The bell jar has a substantially smaller height relative to its diameter as compared to the jar shown in the attached figures). In such an application, accumulation of conductive material on the disk shaped surface of the bell jar opposite the spiral coil will provide conductive paths for eddy currents, preventing plasma ignition. However, by disposing a radially-oriented shade on the disk-shaped end of the jar, opposite to the spiral coil, these conductive paths can be eliminated.

The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. An inductively coupled plasma reactor comprising
   a sealed chamber for accepting a wafer and a process gas to be processed by a plasma sputter process,
   an electrical power supply,
   an inductive coil angularly disposed about an axis for a length along said axis, coupled to said electrical power supply, and positioned adjacent to an outer wall of said chamber for generating a magnetic field inside of said sealed chamber to excite said process gas to create a plasma,
   a shade spaced from an inner wall of said chamber, said shade covering a protected zone of said inner wall which is generally on an opposite side of said chamber wall from a portion of said inductive coil, said shade preventing accumulation of sputtered material in said protected zone, said shade extending, in one angular region of said coil, a distance along said axis of said coil a substantial fraction of the length of said coil, and, in another angular region of said coil, said shade not extending along said axis of said coil any substantial fraction of the length of said coil,
   whereby closed paths for eddy current flow along the chamber walls or said shade are restricted, improving inductive coupling of electrical power to said plasma in said chamber.

2. The reactor of claim 1 wherein said chamber and coil are cylindrical in shape, said coil being cylindrically wound around the cylindrical outer walls of said chamber.

3. The reactor of claim 1 wherein
   said shade has an elongated shape, with the elongated dimension of said shade generally parallel to said axis of said coil.

4. The reactor of claim 3 wherein said shade includes a support in contact with an inner chamber wall and extending generally inwardly from said inner chamber wall, and an elongated hood which extends from said support, covering said protected zone.

5. The reactor of claim 4 wherein said hood extends in a tangential direction from said support.

6. The reactor of claim 4 wherein said shade further comprises a second support in contact with an inner chamber wall and extending generally inwardly from said inner chamber wall, said elongated hood extending between said supports, forming a bench structure covering said protected zone.

7. The reactor of claim 1 wherein said shade extends across the entire length of said coil along said axis.

8. The reactor of claim 1 wherein said shade does not extend around the entire radial dimension of said coil.

9. The reactor of claim 1 wherein said shade comprises first and second shade structures which collectively extend across a substantial fraction of the length of said coil.

10. The reactor of claim 9 wherein said shade structures include support portions and hood portions which overlap to form a single protected zone between said support portions.

11. In an inductively coupled plasma sputter reactor comprising a sealed chamber for accepting a wafer and a process gas to be processed by a plasma sputter process, and an inductive coil angularly disposed about an axis for a length along said axis, coupled to an electrical power supply and positioned adjacent to an outer wall of said chamber for generating a magnetic field inside of said sealed chamber to excite said process gas to create a plasma, a method of improving inductive coupling of electrical power to said plasma, comprising providing a shade spaced from an inner wall of said chamber, said shade covering a protected zone of said inner wall which is generally on an opposite side of said chamber wall from said inductive coil, said shade preventing accumulation of sputtered material in said protected zone, said shade extending, in one angular region of said coil, a distance along said axis of said coil a substantial fraction of the length of said coil, and, in another angular region of said coil, said shade not extending along said axis of said coil any substantial fraction of the length of said coil, whereby closed paths for eddy current flow along said inner chamber wall or said shade are restricted.

12. The method of claim 11 wherein providing said shade comprises providing a shade having an elongated shape, with the elongated dimension of said shade generally parallel to said axis of said coil.

13. The method of claim 12 wherein providing said shade includes providing a support in contact with an inner chamber wall and extending generally inwardly from said inner chamber wall, and providing an elongated hood supported by said support and extending from said support, covering said protected zone.

14. The method of claim 13 wherein providing said shade includes providing a hood which extends in a tangential direction from said support.

15. The method of claim 13 wherein providing said shade includes providing a second support in contact with an inner chamber wall and extending generally inwardly from said inner chamber wall, and providing an elongated hood extending between said supports, forming a bench structure covering said protected zone.

16. The method of claim 12 wherein providing said shade includes providing a shade which extends across the entire length of said coil along said axis.

17. The method of claim 11 wherein providing said shade comprises providing a shade which does not extend around the entire radial dimension of said coil.

18. The method of claim 11 wherein providing said shade comprises providing first and second shade structures which collectively extend across a substantial fraction of the length of said coil.

19. The method of claim 18 wherein said shade structures include support portions and hood portions which overlap to form a single protected zone between said support portions.

20. A method of sputtering a conductive material from a surface disposed in a vacuum chamber, comprising:

evacuating said chamber and providing a process gas to said chamber, electrically exciting said process gas with an electrical coil angularly disposed about an axis for a length along said axis, causing said process gas to form a plasma, and causing ions from said plasma to bombard said surface and sputter said conductive material from said surface, providing a shade disposed on an inner wall of said chamber generally opposite a portion of said coil over a protected zone of said inner wall, said shade preventing accumulation of conductive material in said protective zone, said shade extending, in one angular region of said coil, a distance along said axis of said coil a substantial fraction of the length of said coil, and, in another angular region of said coil, said shade not extending along said axis of said coil any substantial fraction of the length of said coil, whereby closed paths for eddy current flow along said inner chamber or said shade wall are restricted.

21. The method of claim 20 wherein providing said shade includes providing a support in contact with an inner chamber wall and extending generally inwardly from said inner chamber wall, and providing an elongated hood supported by said support and extending from said support, covering said protected zone.

22. The method of claim 21 wherein providing said shade includes providing a hood which extends in a tangential direction from said support.

23. The method of claim 21 wherein providing said shade includes providing a second support in contact with an inner chamber wall and extending generally inwardly from said inner chamber wall, and providing an elongated hood extending between said supports, forming a bench structure covering said protected zone.

24. The method of claim 20 wherein providing said shade includes providing a shade which extends across substantially the entire length of said coil along said axis.

25. The method of claim 20 wherein providing said shade comprises providing a shade which does not extend around the entire radial dimension of said coil.

26. The method of claim 20 wherein providing said shade comprises providing first and second shade structures which collectively extend across a substantial fraction of the length of said coil.

27. The method of claim 26 wherein said shade structures include support portions and hood portions which overlap to form a single protected zone between said support portions.

* * * * *